(12) United States Patent (10) Patent No.: US 8,209,578 B2
Galbraith et al. (45) Date of Patent: Jun. 26, 2012

(54) SYSTEMS USING LOW DENSITY PARITY CHECK CODES FOR CORRECTING ERRORS

(75) Inventors: Richard Leo Galbraith, Rochester, MN (US); Bruce Alexander Wilson, San Jose, CA (US); Travis Roger Oenning, Rochester, MN (US); Mario Blaum, San Jose, CA (US); Ksenija Lakovic, Menlo Park, CA (US); Ivana Djurdjevic, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 1014 days.

(21) Appl. No.: 12/046,108

(22) Filed: Mar. 11, 2008

(65) Prior Publication Data

US 2009/0235142 A1 Sep. 17, 2009

(51) Int. Cl.
*H03M 13/05* (2006.01)
(52) U.S. Cl. .......................................... 714/752
(58) Field of Classification Search .................... 714/752
See application file for complete search history.

(56) References Cited

U.S. PATENT DOCUMENTS

| 7,877,664 | B2 | 1/2011 | Kyung et al. | |
|---|---|---|---|---|
| 2007/0094582 | A1 | 4/2007 | Noda | |
| 2008/0126908 | A1 | 5/2008 | Lin | |
| 2010/0058151 | A1* | 3/2010 | Parker et al. | 714/785 |
| 2010/0083071 | A1* | 4/2010 | Shen et al. | 714/755 |

OTHER PUBLICATIONS

Lu et al. Partition-and-Shift LDPC Codes) 2005 IEEE.*
Pishro-Nik et al. "Performance of Low-Density Partiy-Check Codes with Linear Minimum Distance" 2006 IEEE.*
"Ring of integers—Wikipedia, the free encyclopedia," http://en.wikipedia.org/wiki/Ring_of_integers, Nov. 24, 2007, p. 1.
"Polynomial ring—Wikipedia, the free encyclopedia," http://en.wikipedia.org/wiki/Polynomial_ring, Oct. 25, 2007, pp. 1-5.
R. Michael Tanner, Deepak Sridhara, Arvind Sridharan, Thomas E. Fuja, and Daniel J. Costello, Jr., "LDPC Block and Convolutional Codes Based on Circulant Matrices," IEEE Transactions on Information Theory, vol. 50, No. 12, Dec. 2004, pp. 2966-2984.
Sarah J. Johnson, and Steven R. Weller, "Resolvable 2-Designs for Regular Low-Density Parity-Check Codes," IEEE Transactions on Communications, vol. 51, No. 9, Sep. 2003, pp. 1413-1419.

(Continued)

*Primary Examiner* — Bryce Bonzo
(74) *Attorney, Agent, or Firm* — Steven J. Cahill

(57) ABSTRACT

A system corrects errors in a bit stream. The system includes an encoder and a decoder. The encoder encodes the bit stream using a low density parity check code by inserting parity check bits into the bit stream to generate codewords. The decoder decodes the codewords using parity check equations that are based on the low density parity check code. The parity check bits may comprise no more than four percent of the bits in the codewords of the low density parity check code. The low density parity check code can have a minimum separation of at least 7 between any two ones in each row of a parity-check matrix that is based on the low density parity check code. The encoder and the decoder can be defined in hardware using logic circuits that are interconnected to implement a trellis based on the low density parity check code.

21 Claims, 6 Drawing Sheets

OTHER PUBLICATIONS

Gou Hosoya, Hideki Yagi, Toshiyasu Matsushima, and Shigeichi Hirasawa "Performance of Low-Density Parity-Check Codes for Burst Erasure Channels," International Symposium on Information Theory and its Applications, ISITA2006, Seoul, Korea, Oct. 29-Nov. 1, 2006, pp. 491-496.

Gou Hosoya, Hideki Yagi, and Shigeichi Hirasawa, "Modification Methods for Construction and Performance Analysis of Low-Density Parity-Check Codes over the Markov-Modulated Channels," International Symposium on Information Theory and its Applications ISITA2004, Parma Italy, Oct. 10-13, 2004, pp. 206-211.

Yige Wang, et al., "Construction of High-Girth QC-LDPC Codes," Mitsubishi Electric Research Laboratories, Sep. 2008, pp. 1-6.

James A. McGowan, et al., "Removing Loops from LDPC Codes," Australian Communication Theory Workshop Proceedings 2003, pp. 1-4.

José M.F. Moura, et al., "Structures Low-Density Parity-Check Codes, Methods to Design Regular LDPC Codes with Large Girth," IEEE Signal Processing Magazine, Jan. 2004, pp. 42-55.

Haotian Zhang, et al., "Large Girth LDPC Codes Based on Graphical Models," 2003 4th IEEE Workshop on Signal Processing Advances in Wireless Communications, pp. 100-104.

\* cited by examiner

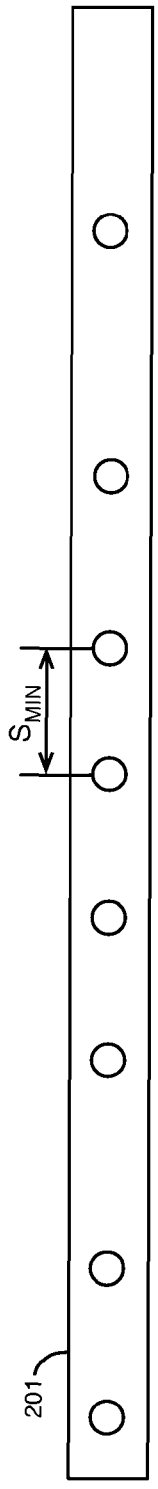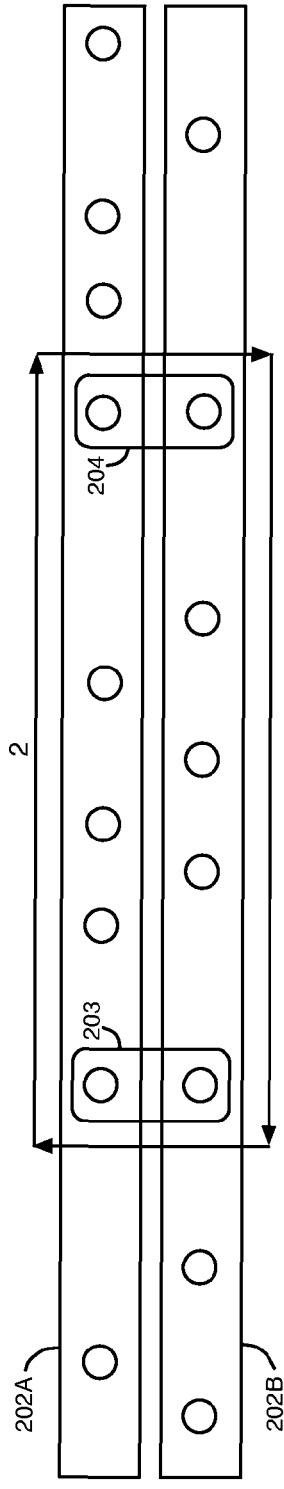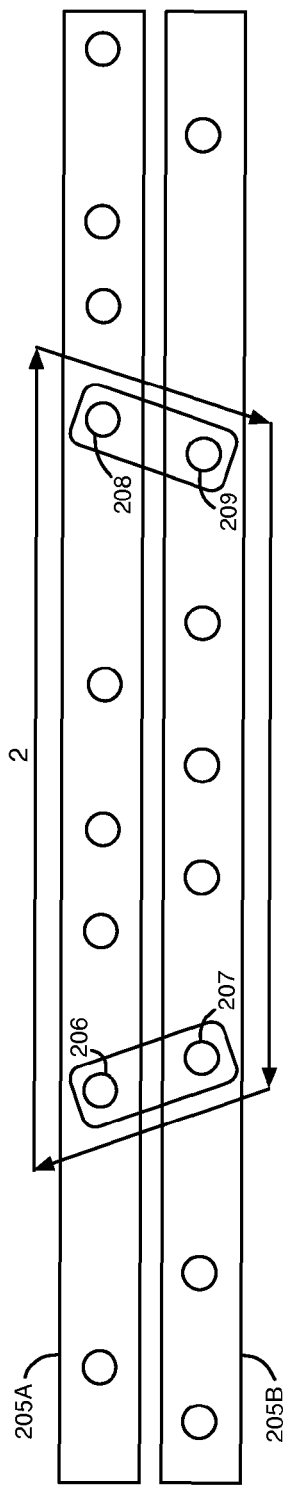

SYSTEMS USING LOW DENSITY PARITY CHECK CODES FOR CORRECTING ERRORS

BACKGROUND OF THE INVENTION

The present invention relates to systems for correcting errors in a bit stream, and more particularly, to systems that use low density parity check codes for correcting errors.

A low density parity check (LDPC) code is a linear error-correcting code that has a parity-check matrix with a small number of nonzero elements in each row and column. LDPC codewords can be decoded using iterative soft-decision decoding. LDPC codes can be defined over any finite field. For example, an LDPC code can be defined over the Galois Field GF(2), in which 1 is the only nonzero element.

BRIEF SUMMARY OF THE INVENTION

A system corrects errors in a bit stream. The system includes an encoder and a decoder. The encoder encodes the bit stream using a low density parity check code by inserting parity check bits into the bit stream to generate codewords. The decoder decodes the codewords using parity check equations that are based on the low density parity check code. In some embodiments, the parity check bits comprise no more than four percent of the bits in the codewords of the low density parity check code.

In other embodiments, the low density parity check code has a minimum separation of at least 7 between any two ones in each row of the parity-check matrix to reduce inter-symbol interference between bits checked by the same parity check equation. In still other embodiments, the encoder and the decoder are defined in hardware using logic circuits. The logic circuits are interconnected to implement a trellis that is based on the low density parity check code. The present invention includes methods and systems for performing the various embodiments described herein.

Various objects, features, and advantages of the present invention will become apparent upon consideration of the following detailed description and the accompanying drawings.

BRIEF DESCRIPTION OF THE DRAWINGS

FIG. 2A illustrates how an LDPC code enforces a minimum separation between any two bits in a row of the parity-check matrix, according to an embodiment of the present invention.

FIG. 2B illustrates an example of two parity check equations in an LDPC code that contains a four cycle.

FIG. 2C illustrates an example of two parity check equations in an LDPC code that contain a pseudo four cycle.

DETAILED DESCRIPTION OF THE INVENTION

Most applications for binary low density parity check (LDPC) codes are in the wired, wireless, and terrestrial communications areas. The data channels used in these systems do not have problems with inter-symbol interference (ISI). In addition, the data channels in these systems do not have a requirement for a very high rate of coding. On the other hand, the data stored on a magnetic disk in a magnetic hard disk drive tends to suffer from ISI. In addition, the properties of a magnetic recording system degrade rapidly as linear density is increased. Magnetic hard disk drives are required to have a large storage density. Codes having a high code rate are needed in order to achieve a large net data storage density in a hard disk drive without increasing the linear density excessively to accommodate redundant parity information introduced by a low rate code.

According to some embodiments of the present invention, binary LDPC codes are provided that have a very high code rate and a very low number of redundant bits in each codeword. Each codeword includes data bits and redundant bits. According to a particular embodiment of the present invention, a binary LDPC code can generate codewords in which 4% or less of the bits in the codewords are redundant bits (e.g., parity bits) added by the LDPC code.

The LDPC codes can be highly structured and can be defined in hardware that does not have a high degree of complexity. The LDPC codes can have a low complexity encoder and message passing implementation. An LDPC code of the present invention has a parity-check matrix with column weight of 1.

The 1s in the rows of the parity-check matrix of an LDPC code can have a guaranteed minimum separation ($S_{MIN}$) constraint to achieve a high level of performance with ISI. The minimum separation $S_{MIN}$ refers to the minimum number of bits between the ones in each row of the parity-check matrix. The LDPC codes can have no 4-cycles (e.g., a girth>=6) for good performance. The LDPC codes can have a small number of pseudo 4-cycles for good performance with ISI. The LDPC codes can support a dynamic length for use with various sector formats. The LDPC code can also support intelligent parity placement to avoid degrading the modulation constraints of the data stream.

Some embodiments of the present invention include LDPC codes that provide many significant advantages when used to encode and decode data stored on data storage devices, such as magnetic hard disk drives. One example of such an LDPC code can be generated using the following pseudo random number sequence {0, 2, 17, 18, 23, 10, 3, 12, 1, 15, 22, 5, 21, 6, 14, 11, 9, 19, 13, 8, 7, 20, 16, 4, repeat}. This pseudo random number sequence is used to form the β matrix shown in FIG. 1. Thus, FIG. 1 illustrates a β matrix generated using the pseudo random number sequence {0, 2, 17, 18, 23, 10, 3, 12, 1, 15, 22, 5, 21, 6, 14, 11, 9, 19, 13, 8, 7, 20, 16, 4, repeat}, according to an embodiment of the present invention.

Figure 1:
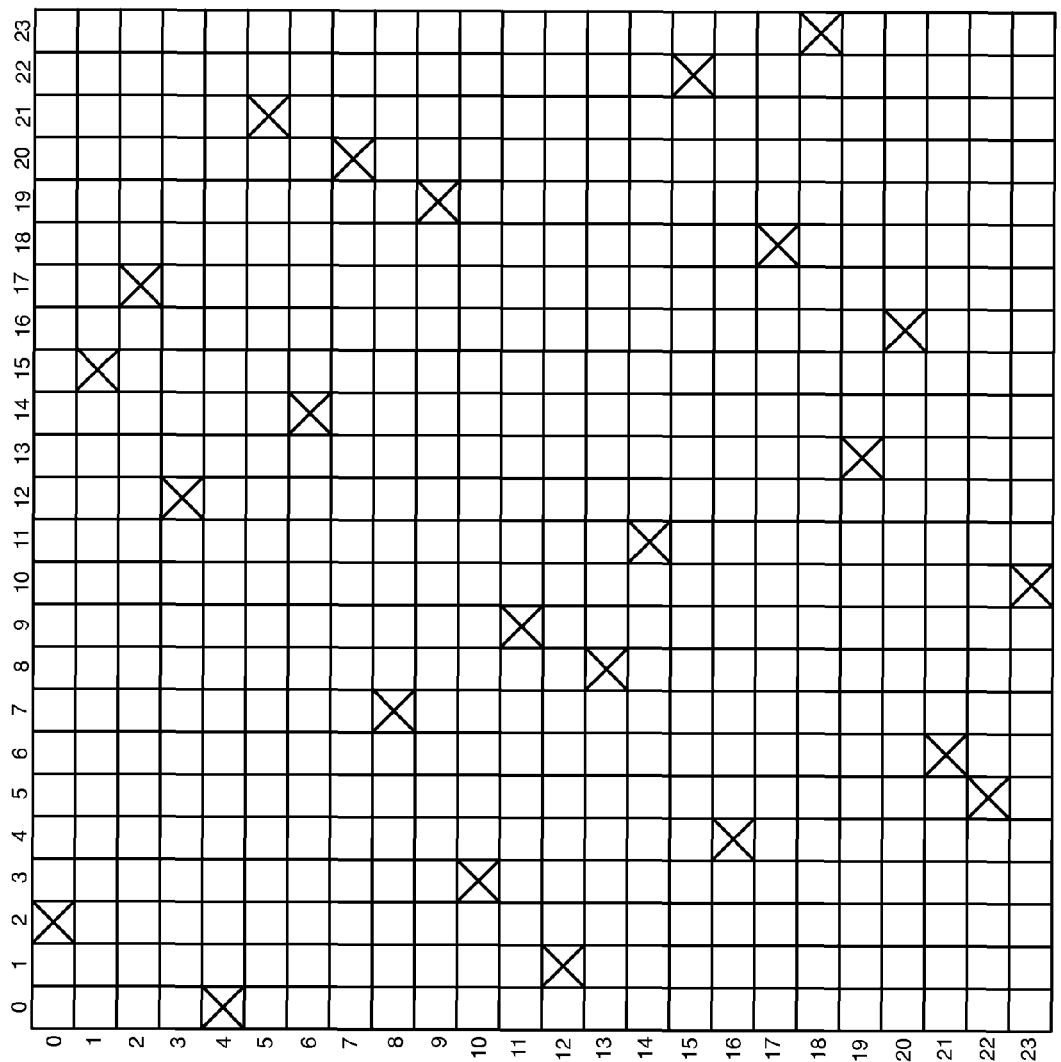
FIG. 1 illustrates a β matrix generated from a pseudo random number sequence that can be used to generate an LDPC code, according to an embodiment of the present invention.

The β matrix of FIG. 1 includes 24 rows numbered 0 through 23, and 24 columns numbered 0 through 23. Each square that has an X in the matrix of FIG. 1 represents a 1 in that particular row and column. Each square that does not have an X in the matrix of FIG. 1 represents a 0 in that particular row and column. The pattern of ones in the β matrix of FIG. 1 is formed using the pseudo random sequence {0, 2, 17, 18, 23, 10, 3, 12, 1, 15, 22, 5, 21, 6, 14, 11, 9, 19, 13, 8, 7, 20, 16, 4, repeat}. For example, a 1 is located in row 0/column 2, a 1 is located in row 2/column 17, a 1 is located in row 17/column 18, a 1 is located in row 18/column 23, etc. The β matrix of FIG. 1 has a single 1 in each row and in each column. Thus, the matrix of FIG. 1 has a row weight of 1 and a column weight of 1.

The parity-check matrix of an LDPC code is generated by concatenating 26 successive powers of the matrix of FIG. 1, such that the LDPC code={$\beta^0, \beta^1, \beta^2, \beta^3, \beta^4, \beta^5, \beta^6, \beta^7, \beta^8, \beta^9, \beta^{10}, \beta^{11}, \beta^{12}, \beta^{13}, \beta^{14}, \beta^{15}, \beta^{16}, \beta^{14}, \beta^{15}, \beta^{16}, \beta^{17}, \beta^{18}, \beta^{19}, \beta^{20}, \beta^{21}, \beta^{22}, \beta^{23}, \beta^{24}, \beta^{25}$}, where β is the matrix of FIG. 1. Each power of the β matrix of FIG. 1 is a matrix of the same dimension that has a row weight of 1 and a column weight of 1 (i.e., it is a permutation matrix). The powers of the β matrix are generated by multiplying the β matrix of FIG. 1 by itself 0, 1, 2, 3, 4, 5, 6, 7, 8, 9, 10, 11, 12, 13, 14, 15, 16, 17, 18, 19, 20, 21, 22, 23, 24, and 25 number of times using matrix multiplication to generate 26 matrices. These 26 matrices are concatenated together. The resulting concatenation of the 26 matrices {$\beta^0, \beta^1, \beta^2, \ldots, \beta^{25}$} has 24 rows and 624 columns. The resulting concatenation of the 26 matrices {$\beta^0, \beta^1, \beta^2, \ldots, \beta^{25}$} is used as the parity-check matrix of an LDPC code having 24 parity check equations. Each of the parity check equations checks the parity of 24 bits.

According to some embodiments, the LDPC code is designed so that any two bits involved in a check in each parity check equation are separated by a minimum separation ($S_{MIN}$). The minimum separation is a unique requirement for ISI systems, such as hard disk drives. FIG. 2A illustrates how an LDPC code enforces a minimum separation between any two 1s in a row of the parity-check matrix, according to an embodiment of the present invention. Box 201 in FIG. 2A represents a codeword that is checked by a parity check equation in an LDPC code. The parity check equation performs an error correction function on codeword 201. Although one parity check equation is described with respect to FIG. 2A, typically an LDPC code contains several parity check equations.

The circles in codeword 201 represent bits in codeword 201 that are checked by the parity check equation to determine if the checked bits have an even parity. Typically, there are bits between the bits represented by the circles. Bits that are not represented by one of the circles are not checked by the parity check equation. For example, one parity check equation may check the parity of 24 bits in a codeword that has thousands of bits. In the example of FIG. 2A, each bit in codeword 201 is checked by one and only one parity check equation in the LDPC code. Thus, the column weight of each column in the LDPC code is 1 in the example of FIG. 2A.

$S_{MIN}$ is the minimum separation. The minimum separation $S_{MIN}$ is the minimum number of bits that can separate any two bits that are checked by a single parity check equation. Bits that are not checked by a parity check equation are counted in determining the minimum separation between two bits that are checked by that parity check equation. The minimum separation $S_{MIN}$ also refers to the number of bits that can separate any two 1s in each row of the parity-check matrix of an LDPC code.

For example, if any two bits checked by the parity check equation are separated by at least 7 bits, then the parity check equation provides a minimum separation of 7. According to some embodiments of the present invention, the bits that are checked by each parity check equation in an LDPC code are separated by at least a minimum separation $S_{MIN}$ (e.g., $S_{MIN}$=7). The minimum separation helps to minimize the amount of inter-symbol interference (ISI) between bits that are checked by parity check equations in the LDPC code. The LDPC code described above with respect to FIG. 1 can provide a minimum separation $S_{MIN}$=7 between bits that are checked by each parity check equation in the LDPC code.

FIG. 2B illustrates an example of two parity check equations in an LDPC code that contains a four cycle. Boxes 202A-202B in FIG. 2B represent a codeword. Codeword 202 is checked by a first parity check equation in an LDPC code in box 202A, and codeword 202 is checked by a second parity check equation in the LDPC code in box 202B. The two parity check equations in the LDPC code perform an error correction function on numerous codewords that are stored in a data storage device, such as a magnetic hard disk drive. The circles in boxes 202A-202B represent bits in codeword 202 that are checked by the two parity check equations to determine if the checked bits have an even parity. An LDPC code typically contains numerous parity check equations, although only two are described with respect to FIG. 2B.

In the example of FIG. 2B, each bit in a codeword is checked by exactly two parity check equations in the LDPC code. Thus, the column weight of each column in the parity-check matrix of the LDPC code is at least two in the example of FIG. 2B. FIG. 2B provides an illustration of a four cycle in two parity check equations. A four cycle occurs when two parity check equations in an LDPC code both check the same two bits in a codeword (e.g., bits 203-204 in codeword 202). A four cycle can cause an undesirable feedback loop between the two parity check equations, as shown by the arrows in FIG. 2B.

In FIG. 2B, bit 203 in codeword 202 is checked by a first parity check equation in box 202A, and bit 203 is checked by a second parity check equation in box 202B. In addition, bit 204 is checked by the first parity check equation in box 202A, and bit 204 is checked by the second parity check equation in box 202B. Because the two bits 203-204 are both checked by the same two parity check equations in the LDPC code, a four cycle occurs in FIG. 2B.

According to an embodiment of the present invention, any two parity check equations in an LDPC code do not contain a four cycle. The LDPC code described above with respect to FIG. 1 does not contain any four cycles. Thus, any two parity check equations in the LDPC code having the parity-check matrix {$\beta^0, \beta^1, \beta^2, \ldots, \beta^{25}$} as described with respect to FIG. 1 do not check the same two bits in a particular codeword. The LDPC code corresponding to FIG. 1 has a parity-check matrix with a column-weight of 1. Therefore, the LDPC code cannot have 4 cycles by definition.

FIG. 2C illustrates an example of two parity check equations in an LDPC code that contain a pseudo four cycle. Boxes 205A and 205B in FIG. 2C represent a codeword 205 that is checked by two parity check equations. Codeword 205 is checked by a first parity check equation in an LDPC code in box 205A, and codeword 205 is checked by a second parity check equation in the LDPC code in box 205B. The two parity check equations in the LDPC code perform an error correction function on numerous codewords that are stored in the data storage device. The circles in boxes 205A-205B represent bits in codeword 205 that are checked by 2 parity check equations to determine if the checked bits have an even parity. The circles in FIG. 2C correspond to the presence of a one in the parity-check matrix.

FIG. 2C provides an illustration of a pseudo four cycle in two parity check equations. A pseudo four cycle occurs when two parity check equations in an LDPC code check two sets of bits, where the bits in each set are separated by one bit location in a codeword. A pseudo four cycle can cause an undesirable feedback loop between the two parity check equations in systems that contain ISI, as shown by the arrows in FIG. 2C.

Bit 206 in codeword 205 is checked by a first parity check equation, and bit 207 in codeword 205 is checked by a second parity check equation. Bit 208 in codeword 205 is checked by the first parity check equation, and bit 209 in codeword 205 is checked by the second parity check equation. Bits 206 and 207 are separated by only one bit location in codeword 205, and bits 208 and 209 are separated by only one bit location in codeword 205. Therefore, the first and the second parity check equations performed in boxes 205A and 205B contain a pseudo four cycle.

According to an embodiment of the present invention, the parity check equations in an LDPC code contain a small number of pseudo four cycles. For example, the LDPC code having the parity-check matrix $\{\beta^0, \beta^1, \beta^2, \ldots, \beta^{25}\}$ as described above with respect to FIG. 1 contains 508 pseudo four cycles.

Figure 2D:
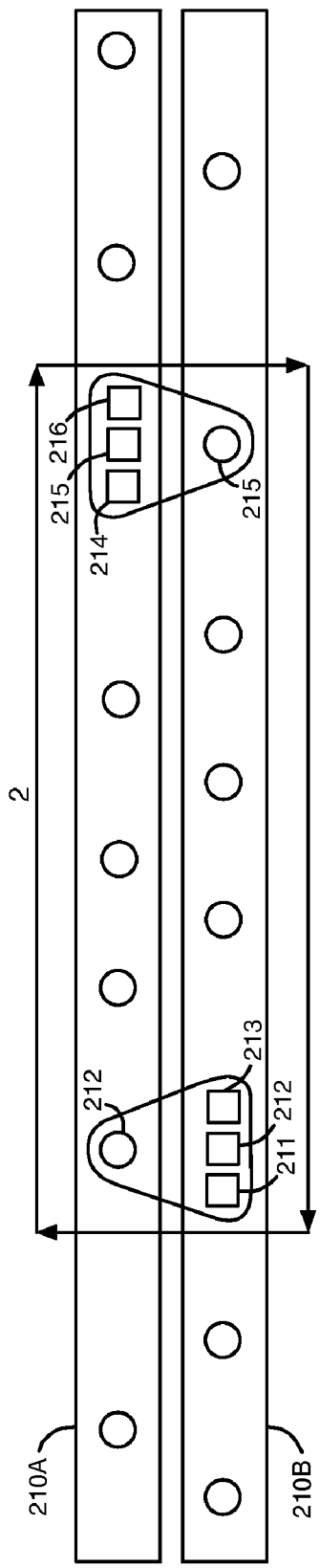
FIG. 2D illustrates an example of two parity check equations in an LDPC code that contain a type 1 proximity four cycle.

FIG. 2D illustrates an example of two parity check equations in an LDPC code that contain a type 1 proximity four cycle. Boxes 210A and 210B in FIG. 2D represent a codeword 210 that is checked by two parity check equations. Codeword 210 is checked by a first parity check equation in an LDPC code in box 210A, and codeword 210 is checked by a second parity check equation in the LDPC code in box 210B. The two parity check equations in the LDPC code perform an error correction function on numerous codewords that are stored in a data storage device. The circles in boxes 210A-210B represent bits in codeword 210 that are checked by 2 parity check equations to determine if the checked bits have an even parity. The circles in FIG. 2D correspond to the presence of a 1 in the parity-check matrix.

The squares 211-216 in FIG. 2D represent bits in a codeword that may or may not be checked by a parity-check equation to determine if they have even parity. At least one of the bits 211-213 corresponds to a 1 in the parity-check matrix, and at least one of the bits 214-216 corresponds to a 1 in the parity-check matrix. At least one of bits 211-213 is checked by the second parity check equation in box 210B, and at least one of bits 214-216 is checked by the first parity check equation in box 210A.

FIG. 2D provides an illustration of a type 1 proximity four cycle in two parity check equations. A type 1 proximity four cycle occurs when two parity check equations in an LDPC code check two sets of bits, where two bits in each set are separated by up to one bit location in a codeword. A type 1 proximity four cycle can cause an undesirable feedback loop between the two parity check equations in systems that contain ISI, as shown by the arrows in FIG. 2D.

Bit 212 in codeword 210 is checked by a first parity check equation. One or more of bits 211-213 in codeword 210 are checked by a second parity check equation. Bit 215 in codeword 210 is checked by the second parity check equation. One or more of bits 214-216 in codeword 210 are checked by the first parity check equation. Bits 211 and 212 are separated by one bit location, bits 212 and 213 are separated by one bit location, bits 214 and 215 are separated by one bit location, and bits 215 and 216 are separated by one bit location. As a result, the first and the second parity check equations performed in boxes 210A and 210B contain a type 1 proximity four cycle.

According to an embodiment of the present invention, the parity check equations in an LDPC code contain a small number of type 1 proximity four cycles. For example, the LDPC code having the parity-check matrix $\{\beta^0, \beta^1, \beta^2, \ldots, \beta^{25}\}$ as described above with respect to FIG. 1 contains 508 type 1 proximity four cycles.

Figure 2E:
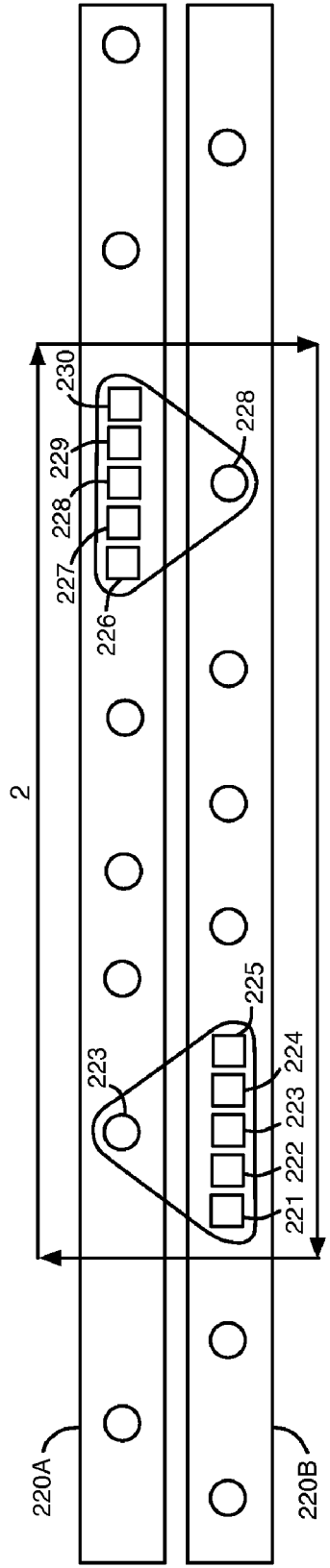
FIG. 2E illustrates an example of two parity check equations in an LDPC code that contain a type 2 proximity four cycle.

FIG. 2E illustrates an example of two parity check equations in an LDPC code that contain a type 2 proximity four cycle. Boxes 220A and 220B in FIG. 2E represent a codeword 220 that is checked by two parity check equations. Codeword 220 is checked by a first parity check equation in an LDPC code in box 220A, and codeword 220 is checked by a second parity check equation in the LDPC code in box 220B. The two parity check equations in the LDPC code perform an error correction function on numerous codewords that are stored in a data storage device. The circles in boxes 220A-220B represent bits in codeword 220 that are checked by 2 parity check equations to determine if the checked bits have an even parity. The circles in FIG. 2E correspond to the presence of a 1 in the parity-check matrix.

The squares 221-230 in FIG. 2E represent bits in a codeword that may or may not be checked by a parity-check equation to determine if they have even parity. At least one of the bits 221-225 corresponds to a 1 in the parity-check matrix, and at least one of the bits 226-230 corresponds to a 1 in the parity-check matrix. At least one of bits 221-225 is checked by the second parity-check equation in box 220B, and at least one of bits 226-230 is checked by the first parity check equation in box 220A.

FIG. 2E provides an illustration of a type 2 proximity four cycle in two parity check equations. A type 2 proximity four cycle occurs when two parity check equations in an LDPC code check two sets of bits, where two bits in each of the sets are separated by up to two bit locations in a codeword. A type 2 proximity four cycle can cause an undesirable feedback loop between the two parity check equations in systems that contain ISI, as shown by the arrows in FIG. 2E.

Bit 223 in codeword 220 is checked by the first parity check equation (box 220A). One or more of bits 221-225 in codeword 220 are checked by the second parity check equation (box 220B). Bit 228 in codeword 220 is checked by the second parity check equation (box 220B). One or more of bits 226-230 in codeword 220 are checked by the first parity check equation (box 220A). Bits 221-225 are located in 5 adjacent bit locations in codeword 220. Bits 226-230 are located in 5 adjacent bit locations in codeword 220. As a result, the first and the second parity check equations performed in boxes 220A and 220B contain a type 2 proximity four cycle.

According to an embodiment of the present invention, the parity check equations in an LDPC code contain a small number of type 2 proximity four cycles. For example, the LDPC code having the parity-check matrix $\{\beta^0, \beta^1, \beta^2, \ldots, \beta^{25}\}$ as described with respect to FIG. 1 contains 2370 type 2 proximity four cycles.

Figure 3:
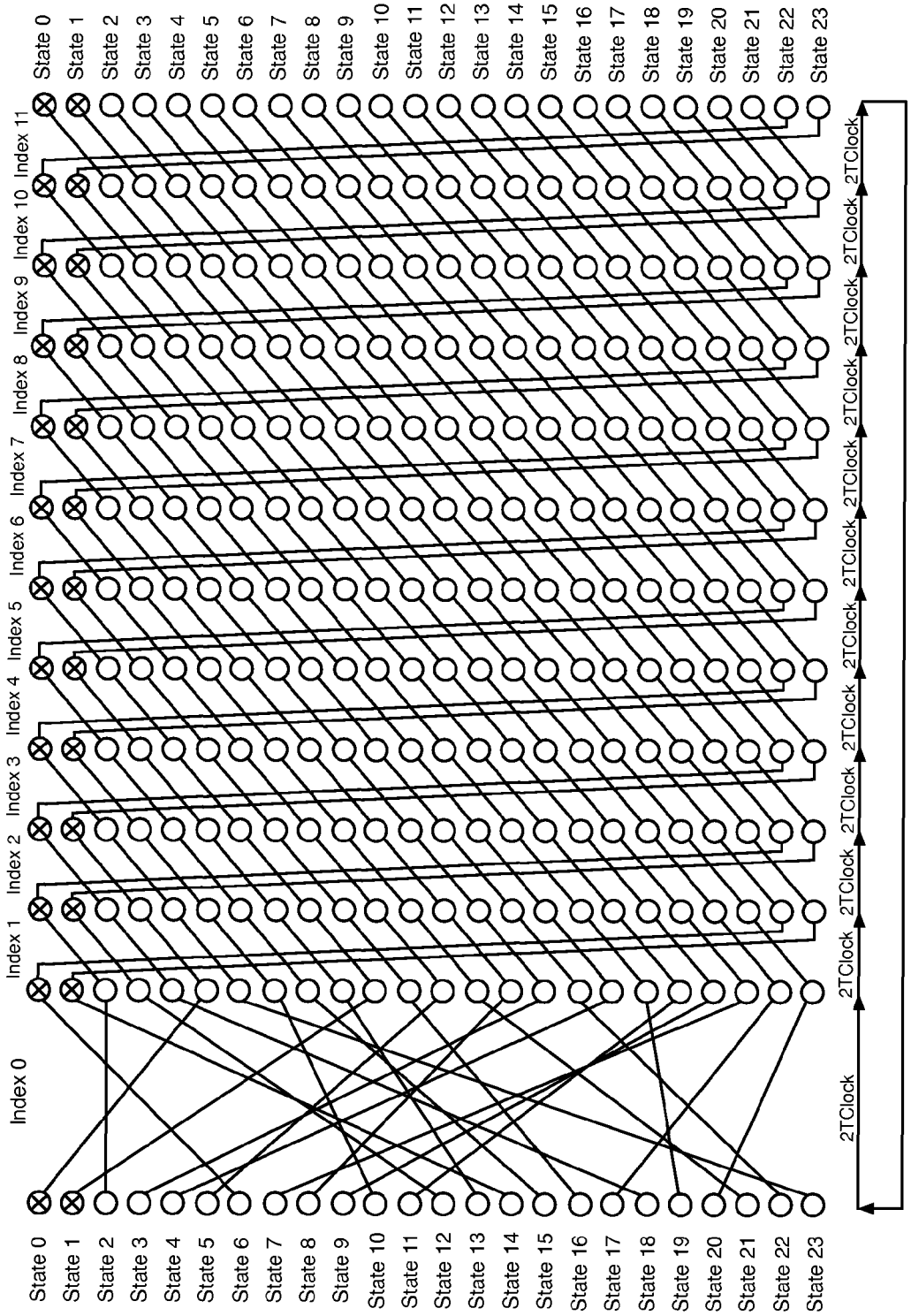
FIG. 3 is a trellis diagram that defines the LDPC code described above with respect to FIG. 1, according to an embodiment of the present invention.

FIG. 3 is a trellis diagram that defines the LDPC code described above with respect to FIG. 1, according to an embodiment of the present invention. The trellis diagram of FIG. 3 defines the LDPC code $\{\beta^0, \beta^1, \beta^2, \ldots, \beta^{25}\}$, where $\beta$ is the matrix shown in FIG. 1. The 24 states (i.e., state 0 through state 23), which are represented by 24 rows of circles in FIG. 3, correspond to 24 parity check equations in the LDPC code. Each of the circles represents a memory element (e.g., a register or latch). The memory elements store state metric information. The state metric information stored in each memory element is transferred to a subsequent memory element in a subsequent clock cycle through hookup connections that are illustrated by the lines connecting the circles in FIG. 3.

The state metric information stored in the memory elements represented by the circles in the trellis diagram of FIG.

3 is passed from left to right through 12 columns of memory elements along the connections shown by the lines. Each set of connections that connects two adjacent columns of memory elements is referred to as an index in FIG. 3. 12 indexes numbered 0-11 are present in the trellis diagram of FIG. 3. The state metric information is transmitted from one column of memory elements to a subsequent column of memory elements in two clock cycles. The rightmost column of memory elements and the leftmost column of memory elements in FIG. 3 are the same memory elements. The state metric information is passed through all 12 columns of memory elements 25 times to complete the LDPC code. The Xs in the first two rows of memory elements in FIG. 3 indicate that the information entering the top two states are the only places of data modification.

According to an embodiment of the present invention, an LDPC code supports intelligent parity placement to avoid degrading the modulation constraints of the bit stream. Parity placement that does not degrade the modulation constraints is especially important in a reverse concatenation encoder that performs modulation encoding before the LDPC encoding. The parity placement can be designed so that the parity check bits are separated by enough of the non-parity bits to avoid degrading the modulation constraints of the combined bit stream.

For example, the LDPC code can generate 24 parity check bits for each codeword, one parity check bit for each parity check equation. The 24 parity check bits can be divided into 12 groups of two bits. The 12 groups of two parity check bits are placed among the non-parity bits so that each 2-bit group of parity check bits is separated by at least 22 of the non-parity bits. Thus, only 2 unmodulated parity check bits are inserted into the bit stream next to each other. As a more specific example, if a bit stream includes a codeword that is formed by 24 vectors of length 24 each, and the bits in each vector are numbered 0 through 23, 2 parity check bits generated by the LDPC code are inserted into each vector at bit locations 4 and 5. These examples are provided for the purpose of illustration and are not intended to limit the scope of the present invention.

According to some embodiments of the present invention, LDPC codes can support a dynamic length for use with various sector formats. For example, a data storage device can have dynamic LDPC codes that encode blocks having 560 bits, 580 bits, or 600 bits. The LDPC code adds 24 parity check bits to each block to generate codewords having a total of 584, 604, or 624 bits. Thus, some embodiments of the present invention include LDPC codes that provide a high code rate, e.g., 560/584, 580/604, or 600/624. 584=(20×28) data bits+24 parity bits. 604=(20×29) data bits+24 parity bits. 624=(20×30) data bits+24 parity bits.

Figure 4:
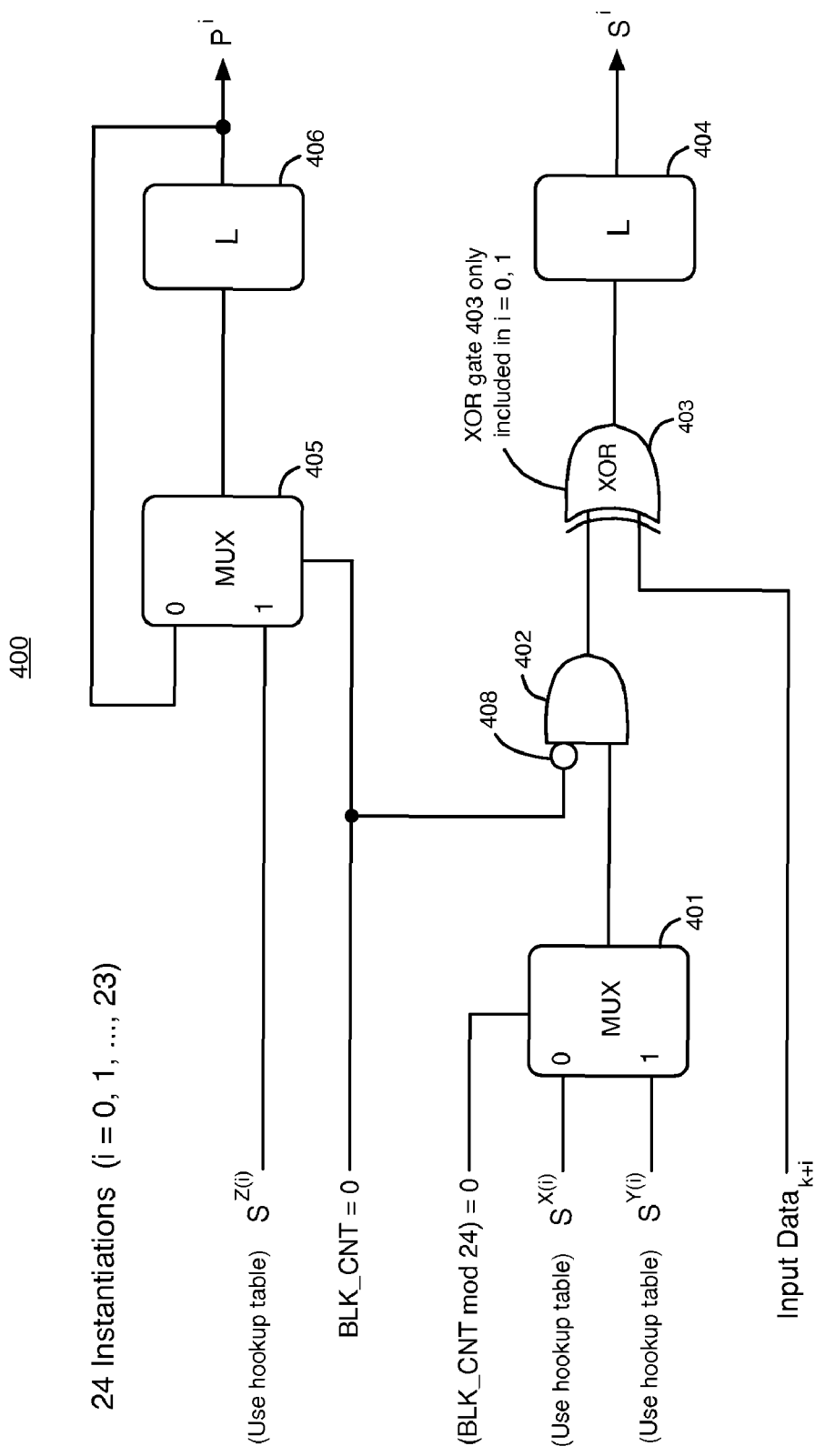
FIG. 4 illustrates a portion of a hardware LDPC encoder, according to an embodiment of the present invention.

According to some embodiments of the present invention, an LDPC code encoder can be defined in a hardware implementation that is not overly complex. FIG. 4 illustrates a portion of a hardware LDPC encoder, according to an embodiment of the present invention. Hardware LDPC encoder portion 400 includes a multiplexer 401, an AND logic gate 402, an XOR (exclusive OR) logic gate 403, a latch 404, a multiplexer 405, a latch 406, and inverter 408. LDPC encoder portion 400 is repeated 24 times in 24 instantiations (i=0, 1, 2, 3, . . . 23) of encoder portion 400 to form a complete LDPC encoder that implements the trellis diagram shown in FIG. 3 and the concatenated matrix $\{\beta^0, \beta^1, \beta^2, \ldots, \beta^{25}\}$, where $\beta$ is the matrix shown in FIG. 1. The encoder shown and described with respect to FIG. 4 is for LDPC codes having a column weight of 1.

The 0 input terminal of multiplexer 405 is coupled to receive the output signal of latch 406. The 1 input terminal of multiplexer 405 is coupled to receive signal $S^{Z(i)}$. The 1 input terminal of multiplexer 401 is coupled to receive signal $S^{Y(i)}$. The 0 input terminal of multiplexer 401 is coupled to receive the signal $S^{X(i)}$. The values of the signals $S^{X(i)}$, $S^{Y(i)}$, and $S^{Z(i)}$ are stored at the output terminal of latch 404.

BLK_CNT is a block count signal that is generated by a counter circuit. The counter circuit increases the BLK_CNT count signal from 0 to M in increments of 2. M is a number that depends on the number of bits in each LDPC codeword. For example, M can be 582, 602, or 622.

The BLK_CNT count signal controls multiplexer 405. When the BLK_CNT count signal equals 0, a logic high state is transmitted to the select input terminal of multiplexer 405 and to inverter 408. The logic high state at the select input terminal of multiplexer 405 causes multiplexer 405 to transmit the $S^{Z(i)}$ signal at its 1 input terminal to the input terminal of latch 406. Inverter 408 inverts the logic high signal and transmits a logic low signal to the first input terminal of AND gate 402. When the BLK_CNT count signal does not equal 0, a logic low state is transmitted to the select input terminal of multiplexer 405 and to inverter 408. The logic low state at the select input terminal of multiplexer 405 causes multiplexer 405 to transmit the output signal of latch 406 to the input terminal of latch 406. Inverter 408 inverts the logic low signal and transmits a logic high signal to the first input terminal of AND gate 402.

BLK_CNT mod 24=0 controls multiplexer 401. In the equation BLK_CNT mod 24=0, "mod" refers to the modulo operation. BLK_CNT mod 24 equals 0 when BLK_CNT equals 0, 24, 48, 72, etc. BLK_CNT increases by 2 in each cycle.

When BLK_CNT mod 24=0, a logic high state is transmitted to the select input terminal of multiplexer 401. The logic high state at the select input terminal of multiplexer 401 causes multiplexer 401 to transmit the $S^{Y(i)}$ signal from its 1 input terminal to the second input terminal of AND gate 402. When BLK_CNT mod 24 does not equal 0, a logic low state is transmitted to the select input terminal of multiplexer 401. A logic low state at the select input terminal of multiplexer 401 causes multiplexer 401 to transmit the $S^{X(i)}$ signal from its 0 input terminal to the second input terminal of AND gate 402.

Multiplexer 401 selects values for $S^{X(i)}$ and $S^{Y(i)}$ that implement the connections shown below index 0 in FIG. 3 during 2 out of every 24 clock cycles. Multiplexer 401 selects values for $S^{X(i)}$ and $S^{Y(i)}$ that implement the connections shown below indexes 1-11 in FIG. 3 during the remaining 22 clock cycles.

Only the first two instantiations of encoder portion 400 (i=0, 1) have XOR gate 403. XOR gate 403 receives a new input data bit (input data$^{k+1}$) in the first two instantiations of encoder portion 400. In the remaining instantiations (i=2, 3, . . . 23) of encoder portion 400, the output terminal of AND gate 402 is coupled to the input terminal of latch 404.

The output signal $S^i$ of latch 404 is the state metric for the current LDPC codeword. The state metric $S^i$ represents intermediate results of the parity check bits. The value of the state metric $S^i$ is transmitted to multiplexers 401 and 405 as the $S^{X(i)}$, $S^{Y(i)}$, and $S^{Z(i)}$ signals in various instantiations of encoder portion 400.

The output state metric $S^i$ of latch 404 in the $i^{th}$ instantiation of encoder portion 400 is transmitted to the 0 input terminal of multiplexer 401 as the $S^{X(i)}$ signal in the instantiation of encoder portion 400 that is identified in the $i^{th}$ row of the X(i) column of the hookup table for the write encoder logic, which is shown in Table 1 below. The output state metric $S^i$ of latch 404 in the $i^{th}$ instantiation of encoder portion 400 is transmitted to the 1 input terminal of multiplexer 401 as the $S^{Y(i)}$ signal in the instantiation of encoder portion 400 that is identified in the $i^{th}$ row of the Y(i) column of the hookup table shown in Table 1 below. The output state metric $S^i$ of latch 404 in the $i^{th}$ instantiation of encoder portion 400 is transmitted to the 1 input terminal of multiplexer 405 as the $S^{Z(i)}$ signal in the instantiation of encoder portion 400 that is identified in the $i^{th}$ row of the appropriate Z(i) column of the hookup table shown in Table 1 below.

TABLE 1

Hookup Table for Write Encoder Logic

| i | X(i) | Y(i) | Z(i) (584) | Z(i) (604) | Z(i) (624) |
|---|------|------|------------|------------|------------|
| 0 | 2 | 6 | 23 | 19 | 23 |
| 1 | 3 | 14 | 22 | 22 | 2 |
| 2 | 4 | 2 | 16 | 3 | 7 |
| 3 | 5 | 12 | 10 | 2 | 6 |
| 4 | 6 | 18 | 9 | 20 | 0 |
| 5 | 7 | 0 | 14 | 14 | 18 |
| 6 | 8 | 23 | 19 | 13 | 17 |
| 7 | 9 | 10 | 1 | 18 | 22 |
| 8 | 10 | 15 | 6 | 23 | 3 |
| 9 | 11 | 13 | 2 | 5 | 9 |
| 10 | 12 | 1 | 21 | 10 | 14 |
| 11 | 13 | 16 | 7 | 6 | 10 |
| 12 | 14 | 5 | 4 | 1 | 5 |
| 13 | 15 | 21 | 13 | 11 | 15 |
| 14 | 16 | 8 | 17 | 8 | 12 |
| 15 | 17 | 3 | 3 | 17 | 21 |
| 16 | 18 | 22 | 12 | 21 | 1 |
| 17 | 19 | 4 | 5 | 7 | 11 |
| 18 | 20 | 19 | 11 | 16 | 20 |
| 19 | 21 | 11 | 8 | 9 | 13 |
| 20 | 22 | 9 | 20 | 15 | 19 |
| 21 | 23 | 7 | 0 | 12 | 16 |
| 22 | 0 | 17 | 18 | 0 | 4 |
| 23 | 1 | 20 | 15 | 4 | 8 |

For example, the output state metric $S^i$ generated at the output terminal of latch 404 in the first instantiation (i=0) of encoder portion 400 is transmitted to the 0 input terminal of multiplexer 401 in the third instantiation (i=2) of encoder portion 400 as signal $S^{X(i)}$ as shown in Table 1. The output state metric $S^i$ generated at the output terminal of latch 404 in the first instantiation (i=0) of encoder portion 400 is also transmitted to the 1 input terminal of multiplexer 401 in the seventh instantiation (i=6) of encoder portion 400 as signal $S^{Y(i)}$ as shown in Table 1. The output state metric $S^i$ generated at the output terminal of latch 404 in the first instantiation (i=0) of encoder portion 400 is also transmitted to the 1 input terminal of multiplexer 405 in the $24^{th}$ instantiation (i=23) of encoder portion 400 as signal $S^{Z(i)}$ as shown in Table 1 for LDPC codewords having 584 or 624 bits.

Table 1 shows the hookup table for the write encoder logic, where parameter i refers to the $i^{th}$ instantiation of LDPC encoder portion 400. The values for X(i), Y(i), and Z(i) shown in Table 1 are based on the connections between the memory elements in the trellis diagram of FIG. 3.

Three different values for Z(i) are listed in Table 1 for each instantiation of encoder portion 400. A particular LDPC encoder uses one of the three different values of Z(i) depending on how many bits are in each LDPC codeword, 584, 604, or 624.

The output signal $P^i$ of latch 406 is the saved parity result from the last LDPC codeword in sequential order of insertion, i=0, 1, 2, . . . 23. The saved parity results $P^i$ from the 24 instantiations of encoder portion 400 are the 24 parity check bits that are inserted into the bit stream to form the LDPC codewords and used by a decoder to perform error correction of bits in the LDPC codewords.

Figure 5:
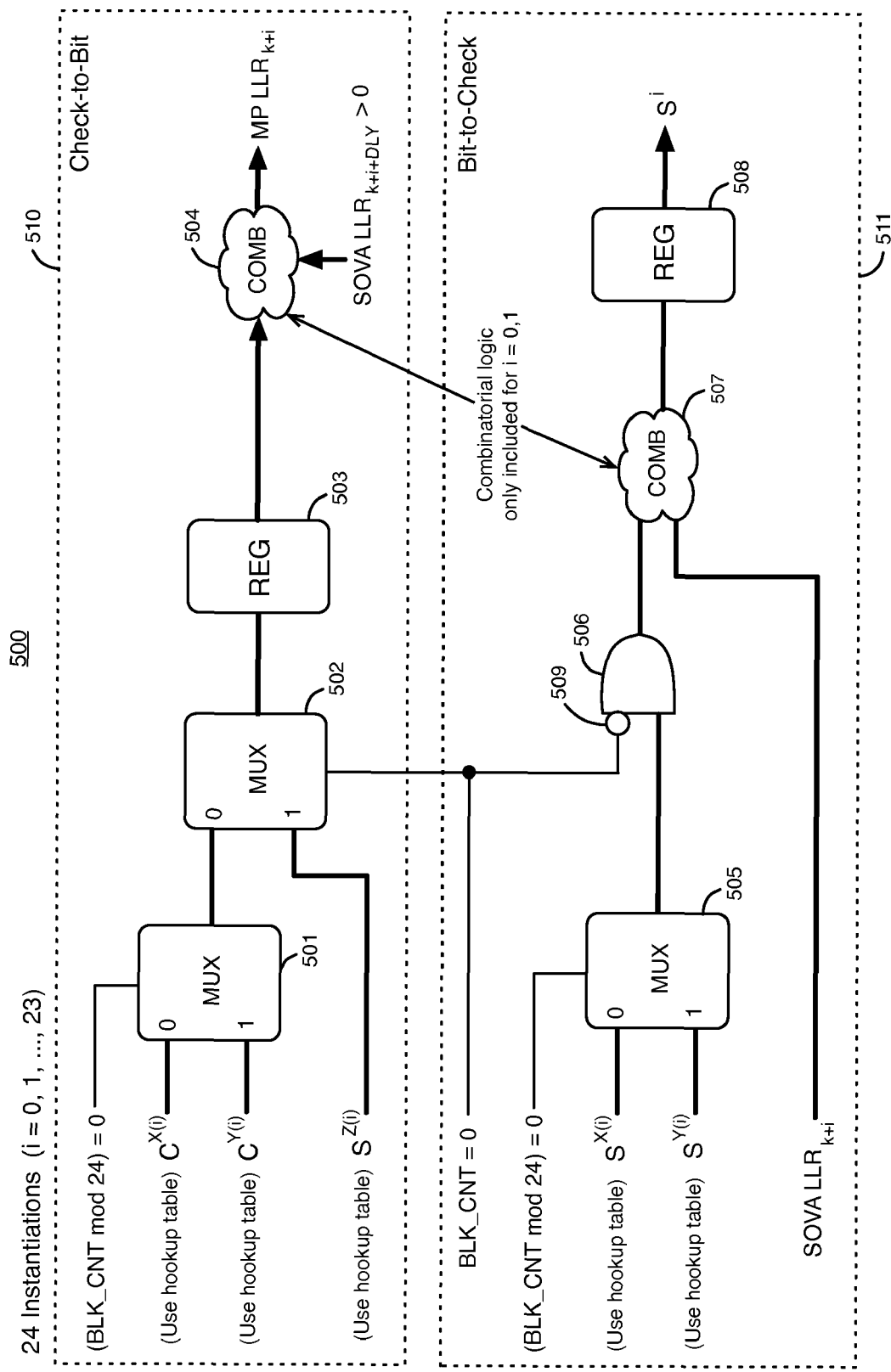
FIG. 5 illustrates a portion of a message passing hardware LDPC decoder, according to an embodiment of the present invention.

FIG. 5 illustrates a portion of a message passing hardware LDPC decoder, according to an embodiment of the present invention. LDPC codes are often decoded using an iterative message-passing decoding algorithm. Message passing LDPC decoder portion 500 in FIG. 5 implements an iterative message passing decoding algorithm for the LDPC code used in the encoder of FIG. 4, which is based on the parity-check matrix $\{\beta^0, \beta^1, \beta^2, \ldots, \beta^{25}\}$ described with respect to FIG. 1. Message passing LDPC decoder portion 500 includes a check-to-bit portion 510 and a bit-to-check portion 511. Check-to-bit portion 510 includes multiplexer 501, multiplexer 502, register 503, and combinatorial logic 504. Bit-to-check portion 511 includes multiplexer 505, AND gate 506, combinatorial logic 507, register 508, and inverter 509.

LDPC decoder portion 500 is repeated 24 times in 24 instantiations (i=0, 1, 2, 3, . . . 23) of decoder portion 500 to form a complete LDPC decoder. The complete LDPC decoder decodes codewords that have been encoded by the FIG. 4 encoder, which is formed by instantiating encoder portion 400 24 times, as described above.

Thus, check-to-bit portion 510 and a bit-to-check portion 511 are each repeated 24 times in the complete decoder. Each instantiation of bit-to-check portion 511 performs the function of one of the 24 parity check equations of the LDPC code. Each instantiation of check-to-bit portion 510 generates a message passing log likelihood ratio (MP LLR$_{k+i}$) that is used to determine whether to flip bits read from the data storage medium or to maintain the bits in their present logic state.

Each of the multiplexers 501, 502, and 505 can be implemented by 18 parallel 2-to-1 multiplexers. Each of the registers 503 and 508 can be implemented by 18 parallel registers. AND gate 506 can be implemented by 18 parallel AND gates. Inverter 509 can be implemented by 18 parallel inverters.

The 0 input terminal of multiplexer 501 is coupled to receive 18-bit parameter $C^{X(i)}$, and the 1 input terminal of multiplexer 501 is coupled to receive 18-bit parameter $C^{Y(i)}$. The 0 input terminal of multiplexer 502 is coupled to receive the 18-bit output parameter of multiplexer 501. The 1 input terminal of multiplexer 502 is coupled to receive 18-bit parameter $S^{Z(i)}$. The 1 input terminal of multiplexer 505 is coupled to receive 18-bit parameter $S^{Y(i)}$. The 0 input terminal of multiplexer 505 is coupled to receive 18-bit parameter $S^{X(i)}$. The values of the 18-bit parameters $S^{X(i)}$, $S^{Y(i)}$, and $S^{Z(i)}$ are stored at the output terminal of register 508.

The BLK_CNT count signal controls multiplexer 502. BLK_CNT increases by 2 in each cycle. When the BLK_CNT count signal equals 0, a logic high state is transmitted to the select input terminal of multiplexer 502 and to inverter 509. The logic high state at the select input terminal of multiplexer 502 causes multiplexer 502 to transmit the $S^{Z(i)}$ parameter at its 1 input terminal to the input terminal of register 503. Inverter 509 inverts the logic high signal and transmits a logic low signal to the first input terminal of AND gate 506. When the BLK_CNT count signal does not equal 0, a logic low state is transmitted to the select input terminal of multiplexer 502 and to inverter 509. The logic low state at the select input terminal of multiplexer 502 causes multiplexer 502 to transmit the output parameter of multiplexer 501 to the input terminal of register 503. Inverter 509 inverts the logic low signal and transmits a logic high signal to the first input terminal of AND gate 506.

BLK_CNT mod 24=0 controls multiplexers 501 and 505. When BLK_CNT mod 24=0, a logic high state is transmitted to the select input terminals of multiplexers 501 and 505. The logic high state at the select input terminal of multiplexer 501 causes multiplexer 501 to transmit the $C^{Y(i)}$ parameter from its 1 input terminal to the 0 input terminal of multiplexer 502. The logic high state at the select input terminal of multiplexer 505 causes multiplexer 505 to transmit the $S^{Y(i)}$ parameter from its 1 input terminal to the second input terminal of AND gate 506. When BLK_CNT mod 24 does not equal 0, a logic low state is transmitted to the select input terminals of multiplexers 501 and 505. A logic low state at the select input terminal of multiplexer 501 causes multiplexer 501 to transmit the $C^{X(i)}$ parameter from its 0 input terminal to the 0 input terminal of multiplexer 502. A logic low state at the select input terminal of multiplexer 505 causes multiplexer 505 to transmit the $S^{X(i)}$ parameter from its 0 input terminal to the second input terminal of AND gate 506.

The 18-bit output parameter of register 503 is processed by combinatorial logic 504 along with a log likelihood ratio ($LLR_{k+i+DLY}>0$) from a soft output Viterbi detector (SOVA), where DLY is a delay parameter. Combinatorial logic 504 generates a message passing log likelihood ratio (MP $LLR_{k+i}$). Only the first two instantiations of decoder portion 500 (i=0, 1) have combinatorial logic 504. In the remaining instantiations (i=2, 3, . . . 23) of decoder portion 500, register 503 stores the MP LLR value at its output.

The 18-bit output parameter of AND gate 506 is processed by combinatorial logic 507 along with a log likelihood ratio ($LLR_{k+1}$) from a soft output Viterbi detector (SOVA). Only the first two instantiations of decoder portion 500 (i=0, 1) have combinatorial logic 507. In the remaining instantiations (i=2, 3, . . . 23) of decoder portion 500, the output terminal of AND gate 506 is coupled directly to the input terminal of register 508.

Combinatorial logic 507 generates an 18-bit state metric $S^i$ that is stored in register 508. Because magnetic data storage devices have ISI, logic 507 uses LLR values of adjacent bits provided from the SOVA to calculate the state metrics. The 18-bit state metric $S^i$ includes one parity bit corresponding to the parity of 24 bits checked using a parity check equation in bit-to-check 511. The state metric $S^i$ also includes 6 bits that indicate the minimum log likelihood ratio (LLR) magnitude of the least reliable bit among the 25 bits checked for parity using the parity check equation. The minimum LLR magnitude is the LLR closest to zero, which indicates the least reliable bit. The 18-bit state metric $S^i$ also includes 5 bits that indicate the location of the least reliable bit in the LDPC codeword. The 18-bit state metric $S^i$ also includes 6 bits that indicate the second minimum LLR magnitude for the second least reliable bit among the 24 bits checked for parity using the parity check equation.

The processed 18-bit output parameter of combinatorial logic 507 is stored in register 508 as the state metric $S^i$ for the current LDPC codeword. The state metric $S^i$ is transmitted to multiplexers 502 and 505 as the 18-bit $S^{X(i)}$, $S^{Y(i)}$, and $S^{Z(i)}$ parameters. The output state metric $S^i$ of register 508 in the $i^{th}$ instantiation of decoder portion 500 is transmitted to the 0 input terminal of multiplexer 505 as the $S^{X(i)}$ parameter in the instantiation of decoder portion 500 identified in the $i^{th}$ row of the X(i) column of the hookup table for the message passing LDPC logic, which is shown in Table 2 below. The output state metric $S^i$ of register 508 the $i^{th}$ instantiation of decoder portion 500 is transmitted to the 1 input terminal of multiplexer 505 as the $S^{Y(i)}$ parameter in the instantiation of decoder portion 500 that is identified by the $i^{th}$ row of the Y(i) column of the hookup table shown in Table 2 below. The output state metric $S^i$ of register 508 in the $i^{th}$ instantiation of decoder portion 500 is transmitted to the 1 input terminal of multiplexer 502 as the $S^{Z(i)}$ parameter in the instantiation of decoder portion 500 that is identified by the $i^{th}$ row of the appropriate Z(i) column of the hookup table shown in Table 2 below.

TABLE 2

Hookup Table for Message Passing LDPC Logic

| i | X(i) | Y(i) | Z(i) (584) | Z(i) (604) | Z(i) (624) |
|---|------|------|------------|------------|------------|
| 0 | 2 | 6 | 18 | 0 | 4 |
| 1 | 3 | 14 | 19 | 13 | 17 |
| 2 | 4 | 2 | 20 | 15 | 19 |
| 3 | 5 | 12 | 21 | 10 | 14 |
| 4 | 6 | 18 | 22 | 22 | 2 |
| 5 | 7 | 0 | 23 | 19 | 23 |
| 6 | 8 | 23 | 0 | 12 | 16 |
| 7 | 9 | 10 | 1 | 18 | 22 |
| 8 | 10 | 15 | 2 | 5 | 9 |
| 9 | 11 | 13 | 3 | 17 | 21 |
| 10 | 12 | 1 | 4 | 1 | 5 |
| 11 | 13 | 16 | 5 | 7 | 11 |
| 12 | 14 | 5 | 6 | 23 | 3 |
| 13 | 15 | 21 | 7 | 6 | 10 |
| 14 | 16 | 8 | 8 | 9 | 13 |
| 15 | 17 | 3 | 9 | 20 | 0 |
| 16 | 18 | 22 | 10 | 2 | 6 |
| 17 | 19 | 4 | 11 | 16 | 20 |
| 18 | 20 | 19 | 12 | 21 | 1 |
| 19 | 21 | 11 | 13 | 11 | 15 |
| 20 | 22 | 9 | 14 | 14 | 18 |
| 21 | 23 | 7 | 15 | 4 | 8 |
| 22 | 0 | 17 | 16 | 3 | 7 |
| 23 | 1 | 20 | 17 | 8 | 12 |

For example, the state metric $S^i$ generated at the output terminal of register 508 in the first instantiation (i=0) of decoder portion 500 is transmitted to the 0 input terminal of multiplexer 505 in the third instantiation (i=2) of decoder portion 500 as parameter $S^{X(i)}$, as shown in Table 2. The state metric $S^i$ generated at the output terminal of register 508 in the first instantiation (i=0) of decoder portion 500 is also transmitted to the 1 input terminal of multiplexer 505 in the seventh instantiation (i=6) of decoder portion 500 as parameter $S^{Y(i)}$ as shown in Table 2. The state metric $S^i$ generated at the output terminal of register 508 in the first instantiation (i=0) of decoder portion 500 is also transmitted to the 1 input terminal of multiplexer 502 in the $19^{th}$ instantiation (i=18) of decoder portion 500 as parameter $S^{Z(i)}$ as shown in Table 2 for LDPC codewords having 584 bits.

The $C^{X(i)}$ and $C^{Y(i)}$ parameters at the input terminals of multiplexer 501 are saved check information generated by combinatorial logic 507 for the previous LDPC codeword and stored in register 508. The completed state metric $S^i$ for a previous LDPC codeword is transmitted from register 508 to multiplexer 501 as the saved check information. Subsequently, bit-to-check portions 511 process the state metrics for the next LDPC codeword. Thus, check-to-bit portions 510 process information for a previous LDPC codeword, while bit-to-check portions 511 concurrently process information for a current LDPC codeword.

The check parameter $C^{X(i)}$ in the $i^{th}$ instantiation of decoder portion 500 is transmitted from register 508 to the 0 input of multiplexer 501 in the instantiation of decoder portion 500 identified in the $i^{th}$ row of the X(i) column of the hookup table shown in Table 2. The check parameter $C^{Y(i)}$ in the $i^{th}$ instantiation of decoder portion 500 is transmitted from register 508 to the 1 input of multiplexer 501 in the instantiation of decoder portion 500 identified in the $i^{th}$ row of the Y(i) column of the hookup table shown in Table 2. For example, check parameter $C^{X(i)}$ is transmitted from register 508 in the $0^{th}$ instantiation of the decoder to the 0 input of multiplexer 501 in the $3^{rd}$ (i=2) instantiation of the decoder. As another example, check parameter $C^{Y(i)}$ is transmitted from register 508 in the $0^{th}$ instantiation of the decoder to the 1 input of multiplexer 501 in the $7^{th}$ (i=6) instantiation of the decoder.

The 18-bit $C^{X(i)}$ and $C^{Y(i)}$ parameters include one parity bit corresponding to the parity of 24 bits checked using a parity check equation in bit-to-check 511. The 18-bit $C^{X(i)}$ and $C^{Y(i)}$ parameters also include 6 bits that indicate the minimum log likelihood ratio (LLR) magnitude of the least reliable bit among the 24 bits checked for parity using the parity check equation. The 18-bit $C^{X(i)}$ and $C^{Y(i)}$ parameters include 5 bits that indicate the location of the least reliable bit in the LDPC codeword. The 18-bit $C^{X(i)}$ and $C^{Y(i)}$ parameters include 6 bits that indicate the second minimum LLR magnitude for the second least reliable bit among the 24 bits checked for parity using the parity check equation.

The foregoing description of the exemplary embodiments of the present invention has been presented for the purposes of illustration and description. It is not intended to be exhaustive or to limit the present invention to the examples disclosed herein. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is not intended that the scope of the present invention be limited with this detailed description.

For example, embodiments of the present invention can be implemented using one or a combination of hardware, software, and a computer-readable medium containing program instructions. Software implemented by embodiments of the present invention and results of the present invention can be stored on a computer-readable medium such as memory, hard disk drive, compact disc (CD), digital video disc (DVD), or other media. Results of the present invention can be used for various purposes such as being executed or processed by a processor, being displayed to a user, transmitted in a signal over a network, etc.

What is claimed is:

1. A system for correcting errors in a bit stream, the system comprising:
   an encoder that encodes the bit stream using a low density parity check code by inserting parity check bits into the bit stream to generate codewords, wherein the parity check bits comprise no more than four percent of the bits in the codewords of the low density parity check code; and
   a decoder that decodes the codewords using parity check equations that are based on the low density parity check code.

2. The system defined in claim 1 wherein the system is a hard disk drive, and the bit stream is read from a magnetic disk in the hard disk drive.

3. The system defined in claim 2 wherein the parity check equations do not contain any four cycles.

4. The system defined in claim 2 wherein the low density parity check code has a minimum separation of at least 7 between any two bits in a codeword that are checked by one of the parity check equations to reduce inter-symbol interference between bits checked by the same parity check equation.

5. The system defined in claim 1 wherein the low density parity check code supports a dynamic length for use with multiple sector formats.

6. The system defined in claim 1 wherein the parity check bits are inserted into each of the codewords in pairs, and each of the pairs in a codeword is separated by at least 22 non-parity check bits.

7. A data storage system for correcting errors in a bit stream, the data storage system comprising:
   an encoder that encodes the bit stream using a low density parity check code by inserting parity check bits into the bit stream to generate codewords, wherein the bit stream is read from a data storage medium in the data storage system; and
   a decoder that decodes the codewords using a parity-check matrix that is based on the low density parity check code, wherein the low density parity check code has a minimum separation of at least 7 bits between any two ones in each row of the parity-check matrix, such that any two bits checked by each parity check equation that is based on a row of the parity-check matrix are separated by at least 7 bits.

8. The data storage system defined in claim 7 wherein the data storage system is a hard disk drive, and the data storage medium is a magnetic disk.

9. The data storage system defined in claim 7 wherein the parity check bits comprise no more than four percent of the bits in the codewords of the low density parity check code.

10. The data storage system defined in claim 7 wherein parity check equations based on the low density parity check code comprise no more than 508 pseudo four cycles.

11. The data storage system defined in claim 7 wherein parity check equations based on the low density parity check code comprise no more than 508 type 1 proximity four cycles.

12. The data storage system defined in claim 7 wherein parity check equations based on the low density parity check code comprise no more than 2370 type 2 proximity four cycles.

13. The data storage system defined in claim 7 wherein the low density parity check code is generated by using number sequence {0, 2, 17, 18, 23, 10, 3, 12, 1, 15, 22, 5, 21, 6, 14, 11, 9, 19, 13, 8, 7, 20, 16, 4, repeat} to form the parity-check matrix.

14. A data storage system for correcting errors in a bit stream generated from a data storage medium, the data storage system comprising:
   an encoder that encodes the bit stream using a low density parity check code by inserting parity check bits into the bit stream to generate codewords, wherein the encoder is defined in hardware using first logic circuits that are interconnected to implement a trellis that is based on the low density parity check code; and
   a decoder that decodes the codewords using parity check equations that are based on the low density parity check code, wherein the decoder is defined in hardware using second logic circuits that are interconnected to implement a trellis that is based on the low density parity check code, wherein the low density parity check code is generated by using number sequence {0, 2, 17, 18, 23, 10, 3, 12, 1, 15, 22, 5, 21, 6, 14, 11, 9, 19, 13, 8, 7, 20, 16, 4, repeat} to form a matrix.

15. The data storage system defined in claim 14 wherein the first logic circuits comprise first multiplexers and first memory circuits, and the second logic circuits comprise second multiplexers and second memory circuits.

16. The data storage system defined in claim 14 wherein the low density parity check code has a minimum separation of at least 7 between any two bits in a codeword that are checked by one of the parity check equations.

17. The data storage system defined in claim 14 wherein the low density parity check code equals {β0, β1, β2, β3, β4, β5, β6, β7, β8, β9, β10, β11, β12, β13, β14, β15, β16, β17, β18, β19, β20, β21, β22, β23, β24, β25}, and wherein β is the matrix defined by the number sequence {0, 2, 17, 18, 23, 10, 3, 12, 1, 15, 22, 5, 21, 6, 14, 11, 9, 19, 13, 8, 7, 20, 16, 4, repeat}.

18. A data storage device for correcting errors in a bit stream generated from a data storage medium, the data storage device comprising:

an encoder that encodes the bit stream using a low density parity check code by inserting parity check bits into the bit stream to generate codewords; and a decoder that decodes the codewords using parity check equations that are based on the low density parity check code, wherein at most four percent of the bits in the codewords of the low density parity check code comprise the parity check bits.

19. A data storage system for correcting errors in a bit stream, the data storage system comprising:

an encoder that encodes the bit stream using a low density parity check code by inserting parity check bits into the bit stream to generate codewords, wherein the bit stream is read from a magnetic data storage medium in the data storage system; and a decoder that decodes the codewords using parity check equations that are based on the low density parity check code, wherein the parity check equations have a maximum of 508 pseudo four cycles, wherein each of the pseudo four cycles occurs when two of the parity check equations check two sets of bits, and the bits in each of the sets are separated by one bit location in a codeword.

20. The data storage system defined in claim 19 wherein the parity check equations have a maximum of 508 type 1 proximity four cycles.

21. The data storage system defined in claim 19 wherein the parity check equations have a maximum of 2370 type 2 proximity four cycles.

* * * * *